(12) United States Patent
Koshimizu et al.

(10) Patent No.: US 9,892,986 B2
(45) Date of Patent: Feb. 13, 2018

(54) PACKAGED WAFER MANUFACTURING METHOD AND DEVICE CHIP MANUFACTURING METHOD

(71) Applicant: DISCO CORPORATION, Tokyo (JP)

(72) Inventors: Hideki Koshimizu, Tokyo (JP); Xin Lu, Tokyo (JP); Yurika Araya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/481,709

(22) Filed: Apr. 7, 2017

(65) Prior Publication Data
US 2017/0294364 A1   Oct. 12, 2017

(30) Foreign Application Priority Data

Apr. 8, 2016   (JP) ................ 2016-077833

(51) Int. Cl.

| | |
|---|---|
| *H01L 21/76* | (2006.01) |
| *H01L 21/00* | (2006.01) |
| *H01L 23/29* | (2006.01) |
| *H01L 21/67* | (2006.01) |
| *H01L 23/31* | (2006.01) |
| *H01L 21/78* | (2006.01) |
| *H01L 21/782* | (2006.01) |

(52) U.S. Cl.
CPC ......... *H01L 23/29* (2013.01); *H01L 21/6715* (2013.01); *H01L 21/67121* (2013.01); *H01L 21/67126* (2013.01); *H01L 21/78* (2013.01); *H01L 21/782* (2013.01); *H01L 23/3178* (2013.01)

(58) Field of Classification Search
CPC .............................. H01L 21/78; H01L 21/782
USPC ......................... 438/458, 462, 598
See application file for complete search history.

(56) References Cited

U.S. PATENT DOCUMENTS

| | | | |
|---|---|---|---|
| 9,466,585 B1* | 10/2016 | Kamphuis | ............... H01L 24/94 |
| 2006/0049487 A1* | 3/2006 | Sato | .................. H01L 21/02203 |
| | | | 257/620 |
| 2013/0161795 A1* | 6/2013 | Owada | ............. H01L 21/76898 |
| | | | 257/620 |
| 2015/0162235 A1* | 6/2015 | Jeon | .................... H01L 21/6835 |
| | | | 438/459 |

FOREIGN PATENT DOCUMENTS

JP      2006-100535      4/2006

* cited by examiner

*Primary Examiner* — David Vu
*Assistant Examiner* — Brandon Fox
(74) *Attorney, Agent, or Firm* — Greer Burns & Crain Ltd.

(57) ABSTRACT

Disclosed herein is a packaged wafer manufacturing method including the steps of forming a groove along each division line on the front side of a wafer, each groove having a depth greater than the finished thickness of the wafer, next removing a chamfered portion from the outer circumference of the wafer to thereby form a step portion having a depth greater than the depth of each groove, next setting a die of a molding apparatus on the bottom surface of the step portion of the wafer in the condition where a space is defined between the die and the wafer, and next filling a mold resin into this space. Accordingly, the device area of the wafer is covered with the mold resin and each groove of the wafer is filled with the mold resin to thereby obtain a packaged wafer.

3 Claims, 8 Drawing Sheets

PACKAGED WAFER MANUFACTURING METHOD AND DEVICE CHIP MANUFACTURING METHOD

BACKGROUND OF THE INVENTION

Field of the Invention

The present invention relates to a manufacturing method for a packaged wafer whose front side is sealed with a mold resin, and also to a manufacturing method for device chips from such a packaged wafer.

Description of the Related Art

In recent years, attention has been paid to wafer level chip size package (WL-CSP) such that an integrated circuit is packaged at a wafer level. In the WL-CSP, a plurality of devices formed on the front side of a wafer are sealed with a mold resin, and the wafer is next divided into individual device chips. Since only the front side of the wafer is covered with the mold resin, the side surface (cut surface) of each device chip divided from the wafer is exposed, resulting in a reduction in appearance. To cope with this problem, there has been proposed a technique including the steps of forming a groove along each division line on the front side of a wafer, next filling each groove with a mold resin, and next dividing the wafer along each division line (each groove filled with the mold resin), thereby covering the side surface of each device chip with the mold resin (see Japanese Patent Laid-Open No. 2006-100535, for example).

SUMMARY OF THE INVENTION

In the technique described in Japanese Patent Laid-Open No. 2006-100535, however, the groove is formed along each division line so as to extend from one end to the other end of each division line. Accordingly, when the front side of the wafer is covered with the mold resin, the mold resin may leak from both ends of each groove exposed to the outer circumference of the wafer. As a result, there is a case that each groove of the wafer cannot be properly filled with the mold resin.

It is therefore an object of the present invention to provide a packaged wafer manufacturing method which can cover the front side of a wafer with a mold resin and can also properly fill each groove of the wafer with the mold resin.

It is another object of the present invention to provide a device chip manufacturing method of manufacturing device chips from a packaged wafer obtained by the above packaged wafer manufacturing method.

In accordance with an aspect of the present invention, there is provided a packaged wafer manufacturing method including a groove forming step of forming a plurality of grooves along a plurality of crossing division lines on the front side of a wafer having a device area where a plurality of devices are formed in a plurality of separate regions defined by the division lines, each device having bumps, the outer circumference of the wafer being formed with a chamfered portion, each groove having a depth greater than the finished thickness of the wafer; a chamfered portion removing step of cutting the chamfered portion of the wafer to a depth greater than the depth of each groove by using a first cutting blade, thereby removing the chamfered portion and resultantly forming a step portion having a flat bottom surface along the outer circumference of the wafer, whereby the device area of the wafer is projected; and a mold resin filling step of using a die of a molding apparatus, the die having a recess adapted to engage with the device area projected, after performing the groove forming step and the chamfered portion removing step, next making the die abut against the bottom surface of the step portion of the wafer in the condition where a predetermined space is defined between the upper surface of the device area and the bottom surface of the recess of the die, and next filling a mold resin into the predetermined space; whereby the device area of the wafer is covered with the mold resin and each groove of the wafer is filled with the mold resin to thereby obtain a packaged wafer.

With this configuration, the groove formed on the front side of the wafer along each division line extends from one end to the other end of each division line. Further, when the chamfered portion of the wafer is removed, the device area is projected. Further, when the recess of the die of the molding apparatus is engaged with the device area projected, the die comes into abutment against the bottom surface of the step portion of the wafer at a level lower than the bottom of each groove formed on the front side of the wafer, thereby liquid-sealing the outer circumference of the wafer. Accordingly, when the mold resin is filled into the space defined between the die and the wafer, there is no possibility of leakage of the mold resin from the outer circumference of the wafer to the outside thereof. As a result, the packaged wafer can be well manufactured, wherein the device area is covered with the mold resin and each groove is filled with the mold resin.

Preferably, the packaged wafer manufacturing method further includes a peripheral cut groove forming step of cutting the outer circumferential portion of the wafer at both ends of at least one of the division lines by using a second cutting blade before or after performing the chamfered portion removing step, thereby forming a peripheral cut groove aligned with the at least one division line; the peripheral cut groove being used as an alignment mark in a subsequent step to be performed after the peripheral cut groove forming step.

In accordance with another aspect of the present invention, there is provided a device chip manufacturing method including a groove forming step of forming a plurality of grooves along a plurality of crossing division lines on the front side of a wafer having a device area where a plurality of devices are formed in a plurality of separate regions defined by the division lines, each device having bumps, the outer circumference of the wafer being formed with a chamfered portion, each groove having a depth greater than the finished thickness of the wafer; a chamfered portion removing step of cutting the chamfered portion of the wafer to a depth greater than the depth of each groove by using a first cutting blade, thereby removing the chamfered portion and resultantly forming a step portion having a flat bottom surface along the outer circumference of the wafer, whereby the device area of the wafer is projected; a peripheral cut groove forming step of cutting the outer circumferential portion of the wafer at both ends of at least one of the division lines by using a second cutting blade, thereby forming a peripheral cut groove aligned with the at least one division line; a mold resin filling step of using a die of a molding apparatus, the die having a recess adapted to engage with the device area projected, after performing the chamfered portion removing step, next making the die abut against the bottom surface of the step portion of the wafer in the condition where a predetermined space is defined between the upper surface of the device area and the bottom surface of the recess of the die, and next filling a mold resin into the predetermined space, whereby the device area of the wafer is covered with the mold resin and each groove of the wafer is filled with the mold resin to thereby obtain a packaged wafer; an alignment step of aligning a third cutting blade with each division line of the wafer with reference to the peripheral cut groove as an alignment mark, after performing the mold resin filling step; a cut groove forming step of cutting the front side of the packaged wafer along each division line by using the third cutting blade having a thickness smaller than the width of each groove filled with the mold resin, after performing the alignment step, thereby forming a cut groove along the center of each groove filled with the mold resin, the cut groove having a depth greater than the finished thickness of each device chip to be formed from the packaged wafer; and a dividing step of grinding the back side of the packaged wafer until the thickness of the packaged wafer becomes the finished thickness of each device chip, after performing the cut groove forming step, thereby exposing each cut groove to the back side of the packaged wafer and resultantly dividing the packaged wafer into individual device chips each surrounded by the mold resin.

According to the present invention, the groove is formed along each division line on the front side of the wafer, and the chamfered portion of the wafer is next removed to thereby project the device area of the wafer, so that the recess of the die of the molding apparatus can be engaged with the device area projected. Accordingly, when the recess of the die is engaged with the device area projected, the mold resin filled into the space defined between the die and the wafer is prevented from leaking from the outer circumference of the wafer to the outside thereof. Thusly, the packaged wafer can be well manufactured, wherein the device area is covered with the mold resin and each groove is filled with the mold resin.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
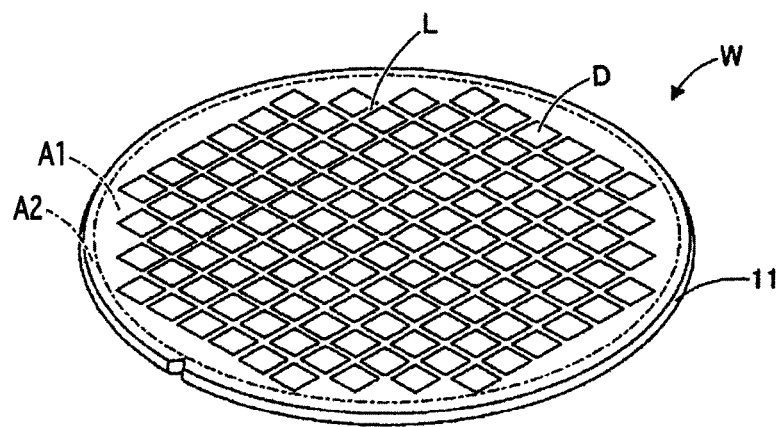
FIG. 1 is a perspective view of a wafer according to a preferred embodiment of the present invention.
Figure 2A:
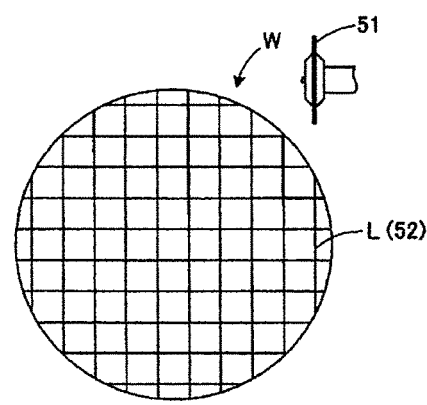
FIG. 2A is a plan view depicting a groove forming step in a first comparison.
Figure 2B:
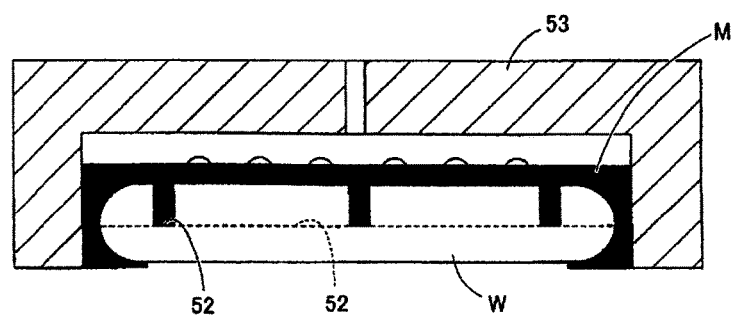
FIG. 2B is a sectional view depicting a mold resin filling step in the first comparison.
Figure 3A:
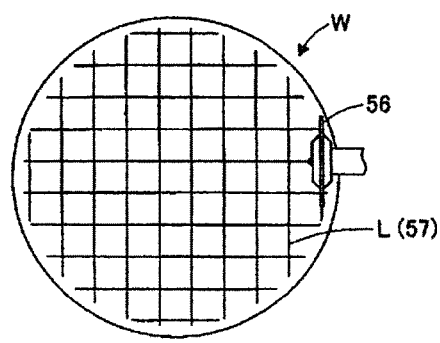
FIG. 3A is a plan view depicting a groove forming step in a second comparison.
Figure 3B:
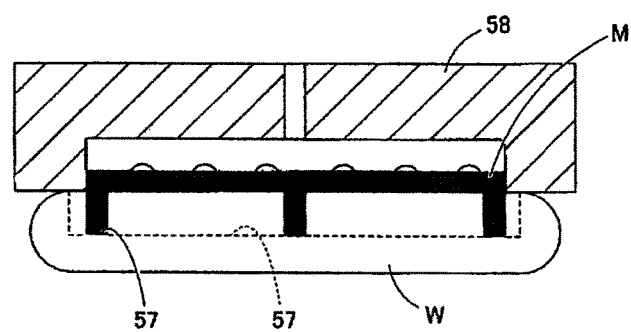
FIG. 3B is a sectional view depicting a mold resin filling step in the second comparison.

A packaged wafer manufacturing method according to a preferred embodiment of the present invention will now be described with reference to the attached drawings. First, a wafer W to be packaged will now be described with reference to FIG. 1. FIG. 1 is a perspective view of the wafer W according to this preferred embodiment. FIGS. 2A and 2B depict a packaged wafer manufacturing method in the prior art as a comparison. FIGS. 3A and 3B depict another packaged wafer manufacturing method in the prior art as another comparison. In each of FIGS. 2B and 3B, the broken line depicts a bottom of each groove extending in a lateral direction on the sheet plane of the drawing.

As depicted in FIG. 1, a plurality of crossing division lines L are formed on the front side of the wafer W to thereby define a plurality of separate regions where a plurality of devices D with bumps (not depicted) are formed. The front side of the wafer W includes a device area A1 where the plural devices D are formed and a peripheral marginal area A2 surrounding the device area A1. The outer circumference of the peripheral marginal area A2 is formed with a chamfered portion 11, so as to prevent chipping of the wafer W. For example, the wafer W is a semiconductor wafer configured by forming semiconductor devices such as integrated circuits (ICs) and large-scale integrations (LSIs) on a semiconductor substrate.

Usually, the front side of such a wafer W is sealed with a mold resin to thereby manufacture a packaged wafer. When this packaged wafer is divided into device chips, only the device surface of each device chip (the front side thereof) is covered with the mold resin, and the side surface of each device chip is exposed to cause a reduction in appearance. To cope with this problem, the method depicted in FIGS. 2A and 2B may be considered. As depicted in FIG. 2A, the front side of the wafer W is half-cut along each division line L from one end to the other end thereof by using a cutting blade 51 to thereby form a groove 52 along each division line L. Thereafter, as depicted in FIG. 2B, each groove 52 is filled with a mold resin M. Accordingly, the side surface of each device chip obtained by dividing the wafer W can be covered with the mold resin M.

In this case, the whole of the wafer W is covered with a die 53 in the condition where a space is defined between the die 53 and the front side of the wafer W as depicted in FIG. 2B. In this condition, the mold resin M is supplied into this space. However, since both ends of each groove 52 are exposed to the outer circumference of the wafer W, the mold resin M supplied enters each groove 52 and then leaks from both ends of each groove 52. Accordingly, the front side of the wafer W is entirely covered with the mold resin M in such a manner that each division line L (each groove 52) is completely hidden by the mold resin M. As a result, the wafer W covered with the mold resin M cannot be divided along each division line L in a subsequent step. To cope with this problem, the mold resin M covering the peripheral portion of the wafer W must be removed by polishing or trimming, for example, thereby partially exposing each division line L at the peripheral portion of the wafer W, resulting in an increase in number of man-hours.

As another method depicted in FIG. 3A, the wafer W is half-cut along each division line L by using a cutting blade 56 in the condition where the peripheral portion of the wafer W is left, thereby forming a groove 57 along each division line L in only the inside area of the wafer W. That is, each groove 57 is not formed at the peripheral portion of the wafer W. Thereafter, as depicted in FIG. 3B, each groove 57 is filled with a mold resin M. In this case, a die 58 is mounted on the peripheral portion of the wafer W to define a space between the die 58 and the front side of the wafer W as depicted in FIG. 3B. In this condition, the mold resin M is supplied into this space. Since each groove 57 is formed in only the inside area of the wafer W, the mold resin M supplied does not leak from both ends of each groove 57. Accordingly, the peripheral portion of the wafer W on which the die 58 is mounted is not covered with the mold resin M, so that each division line L (each groove 57) is partially exposed at the peripheral portion of the wafer W.

However, in forming each groove 57 in only the inside area of the wafer W, the cutting blade 56 (see FIG. 3A) being rotated is lowered from the position directly above the wafer W at starting the cutting operation (chopper cut). In this case, the cutting blade 56 must be slowly lowered, so as to prevent damage to the wafer W. Thus, this method has an advantage such that the number of man-hours for polishing or the like can be reduced because the peripheral portion of the wafer W is not covered with the mold resin M. However, the time required for formation of each groove 57 on the wafer W is increased due to the above chopper cut, causing a reduction in working efficiency. Under these circumstances, it is desirable to develop a packaged wafer manufacturing method considering not only the number of man-hours, but also the time required for formation of each groove 57 on the wafer W.

In consideration of the above problems, the packaged wafer manufacturing method according to this preferred embodiment includes the steps of forming a groove 12 on the front side of the wafer W along each division line L in such a manner that the groove 12 extends from one end to the other end of each division line L, next removing the chamfered portion 11 along the outer circumference of the wafer W to thereby project the device area A1, and next engaging a die 36 having a recess with the device area A1 projected (see FIGS. 4 to 7). Thereafter, a mold resin M is supplied into a space defined between the die 36 and the wafer W in the condition where the outer circumference of the wafer W is liquid-sealed by the die 36 engaged with the wafer W, thereby suppressing the leakage of the mold resin M from the outer circumference of the wafer W. Further, each groove 12 is formed by using a cutting blade in such a manner that the cutting blade starts cutting the wafer W from its outer circumference, thereby preventing an increase in time required for formation of each groove 12 on the wafer W.

Figure 4:
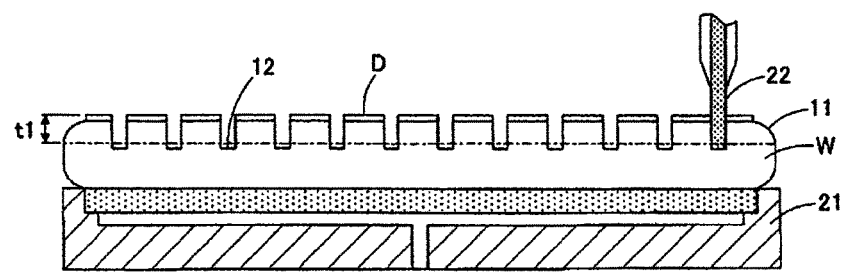
FIG. 4 is a sectional view depicting a groove forming step of a packaged wafer manufacturing method according to a preferred embodiment of the present invention.
Figure 5:
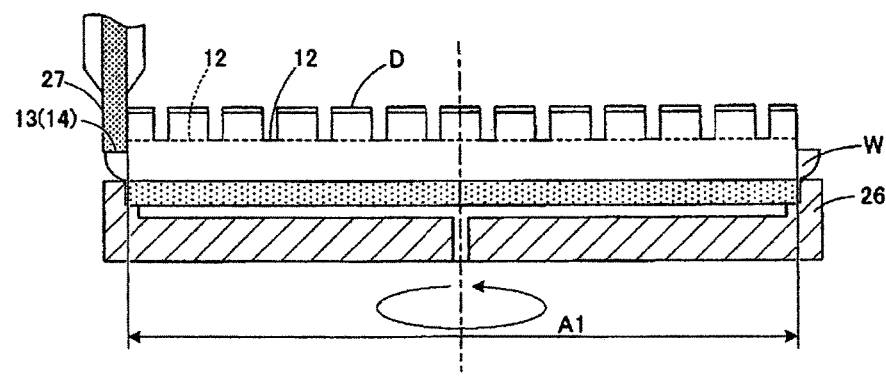
FIG. 5 is a sectional view depicting a chamfered portion removing step of the packaged wafer manufacturing method.
Figure 6:
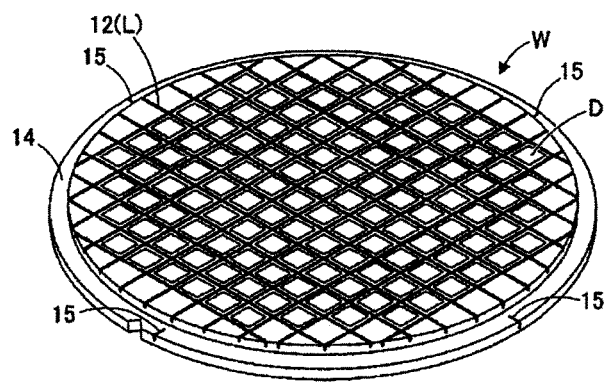
FIG. 6 is a perspective view of the wafer processed by a peripheral cut groove forming step of the packaged wafer manufacturing method.
Figure 7:
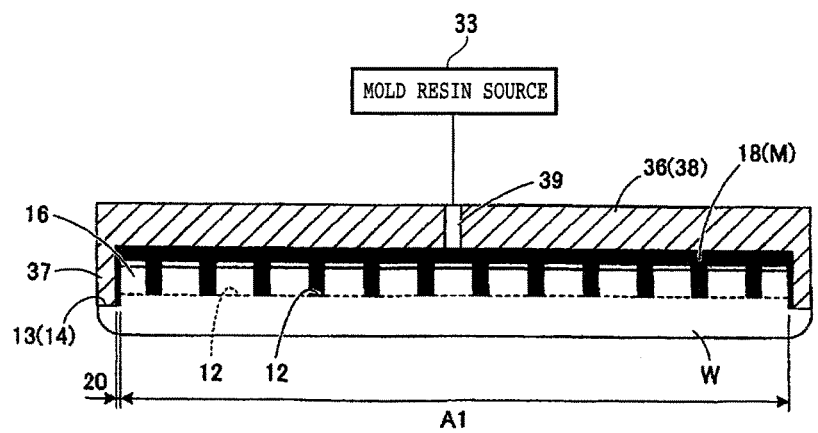
FIG. 7 is a sectional view depicting a mold resin filling step of the packaged wafer manufacturing method.
Figure 8:
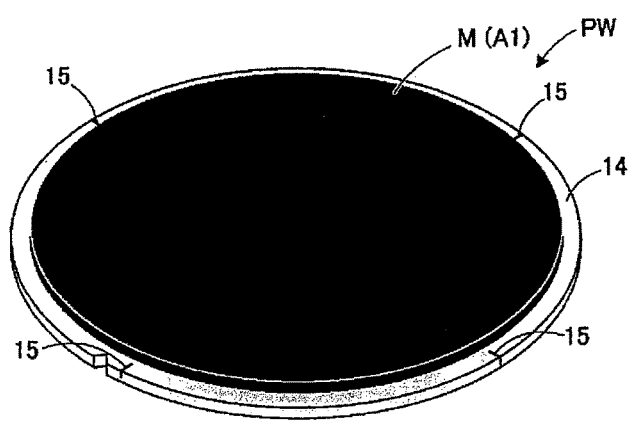
FIG. 8 is a perspective view of a packaged wafer obtained by the packaged wafer manufacturing method.

The packaged wafer manufacturing method according to this preferred embodiment will now be described in more detail with reference to FIGS. 4 to 8. FIG. 4 depicts a groove forming step, FIG. 5 depicts a chamfered portion removing step, FIG. 6 depicts a peripheral cut groove forming step, and FIG. 7 depicts a mold resin filling step. Further, FIG. 8 is a perspective view of a packaged wafer PW obtained by the method according to this preferred embodiment. In the following description, the bumps formed on each device D will be omitted for convenience of illustration. In each of FIGS. 5 and 7, the broken line depicts a bottom of each groove 12 extending in a lateral direction on the sheet plane of the drawing.

First, the groove forming step is performed as depicted in FIG. 4. In the groove forming step, the wafer W is transferred to a chuck table 21 of a cutting apparatus and then held on the chuck table 21 under suction in the condition where the front side of the wafer W is oriented upward. Thereafter, a cutting blade 22 is aligned with a predetermined one of the division lines L (see FIG. 1) at a position radially outside the wafer W. Thereafter, the cutting blade 22 is lowered to a depth greater than the finished thickness t1 of the wafer W. Thereafter, the cutting blade 22 is rotated and the chuck table 21 is fed relative to the cutting blade 22. As a result, the wafer W held on the chuck table 21 is half-cut along the predetermined division line L by the cutting blade 22 to thereby form a groove 12 along this predetermined division line L, wherein the depth of the groove 12 is greater than the finished thickness t1.

This cutting operation is repeated for all of the other division lines L of the wafer W held on the chuck table 21, thereby forming a similar groove 12 along each division line L as depicted in FIG. 4. In the above cutting operation, the cutting blade 22 starts cutting the wafer W along each division line L from one end to the other end thereof. That is, the cutting blade 22 being rotated is not lowered from the position directly above the wafer W, i.e., the chopper cut is not performed, so that the time required for formation of each groove 12 on the wafer W can be reduced. The finished thickness t1 of the wafer W means the thickness of the wafer W ground in a device chip manufacturing method to be hereinafter described.

After performing the groove forming step, the chamfered portion removing step is performed as depicted in FIG. 5. In the chamfered portion removing step, the wafer W is transferred to a chuck table 26 of a trimming apparatus and then held on the chuck table 26 under suction in the condition where the front side of the wafer W is oriented upward. The wafer W is held on the chuck table 26 so that the center of the wafer W coincides with the axis of rotation of the chuck table 26. In this condition, a cutting blade 27 is positioned directly above the chamfered portion 11 (see FIG. 4) of the wafer W. Thereafter, the cutting blade 27 is rotated at a high speed and then lowered to cut the chamfered portion 11 of the wafer W to a depth greater than the depth of the groove 12 formed along each division line L (see FIG. 1).

Thereafter, the chuck table 26 is rotated relative to the cutting blade 27 to thereby remove the chamfered portion 11 (see FIG. 4) of the wafer W along the whole of the outer circumference thereof. As a result, a step portion 13 having a depth greater than the depth of each groove 12 is formed along the whole of the outer circumference of the wafer W. Since the chamfered portion 11 is annularly removed along the whole of the outer circumference of the wafer W, only the device area A1 is left as a projecting portion on the front side of the wafer W after removing the chamfered portion 11. Further, the shape of the outer circumference of the cutting blade 27 is flat in cross section, so that the step portion 13 has a flat bottom surface 14 as left after removing the chamfered portion 11 from the wafer W. As a modification, the chamfered portion removing step may be performed before performing the groove forming step.

After performing the chamfered portion removing step, the peripheral cut groove forming step is performed as depicted in FIG. 6. In the peripheral cut groove forming step, the wafer W is transferred to a chuck table (not depicted) of a cutting apparatus and then held on this chuck table under suction in the condition where the front side of the wafer W is oriented upward. Thereafter, a cutting blade (not depicted) is aligned with a predetermined one of the division lines L at a position radially outside the wafer W. Thereafter, the cutting blade is lowered to a depth greater than the level of the bottom surface 14 of the step portion 13 formed by removing the chamfered portion 11 of the wafer W. Thereafter, the cutting blade is rotated and the chuck table is slightly fed relative to the cutting blade. As a result, the outer circumferential portion of the bottom surface 14 is cut by the cutting blade to thereby form a peripheral cut groove 15 aligned with the predetermined division line L.

This cutting operation is similarly performed at the other three positions as depicted in FIG. 6. That is, totally four peripheral cut grooves 15 are formed at the outer circumferential portion of the bottom surface 14 of the step portion 13 of the wafer W, wherein these four peripheral cut grooves 15 coincide with the extensions of any two perpendicular ones of the division lines L. Each peripheral cut groove 15 is used as an alignment mark for alignment between a cutting blade and each division line L in the device chip manufacturing method to be hereinafter described. As a modification, the peripheral cut groove forming step may be performed before performing the chamfered portion removing step. In this case, the chamfered portion 11 of the wafer W is cut somewhat deeply so that the peripheral cut grooves 15 are left even after removing the chamfered portion 11.

After performing the peripheral cut groove forming step, the mold resin filling step is performed as depicted in FIG. 7. In the mold resin filling step, the wafer W is transferred to a molding apparatus (not depicted) having a die 36 and the front side of the wafer W is covered with the die 36. The die 36 has a recess adapted to engage with the device area A1 projected by removing the chamfered portion 11 (see FIG. 4) of the wafer W. That is, the die 36 includes an annular side wall 37 and a top wall 38 connected to the upper end of the annular side wall 37, thereby forming this recess. The lower end surface of the side wall 37 of the die 36 is adapted to abut against the bottom surface 14 of the step portion 13 of the wafer W. Further, the inner surface of the side wall 37 is adapted to engage with an outer circumferential portion 16 of the device area A1 projected. In the condition where the die 36 is set on the wafer W, a space 18 is defined between the upper surface of the device area A1 of the wafer W and the bottom surface of the recess of the die 36.

To facilitate the engagement of the die 36 with the front side of the wafer W, a slight clearance 20 is defined between the side wall 37 of the die 36 and the outer circumferential portion 16 of the device area A1 projected. Further, since the bottom surface 14 of the step portion 13 of the wafer W is lower in level than the bottom of the groove 12 formed along each division line L (see FIG. 6), the space 18 defined between the die 36 and the wafer W is liquid-sealed by the side wall 37 set on the bottom surface 14 of the step portion 13. In this manner, the die 36 is tightly set on the wafer W. Thereafter, a mold resin M is supplied from a mold resin source 33 to the die 36. The mold resin M is then filled through an inlet hole 39 formed in the top wall 38 into the space 18 defined between the die 36 and the upper surface of the device area A1.

When the mold resin M is filled into the space 18, the mold resin M enters the groove 12 formed along each division line L from the upper surface of the device area A1 and then flows in each groove 12 toward the radial outside of the wafer W. When the mold resin M in each groove 12 reaches the side wall 37 of the die 36, the mold resin M slowly flows down to the bottom surface 14 of the step portion 13 through the clearance 20 defined between the side wall 37 of the die 36 and the outer circumferential portion 16 of the device area A1 projected. At this time, the mold resin M can be reliably stopped by the side wall 37 of the die 36 because the bottom end surface of the side wall 37 abuts against the bottom surface 14 of the step portion 13. Accordingly, the front side (the device area A1) of the wafer W is covered with the mold resin M without the leakage of the mold resin M from the outer circumference of the wafer W.

In this manner, a packaged wafer PW depicted in FIG. 8 is manufactured, wherein the device area A1 is covered with the mold resin M and the groove 12 (see FIG. 6) formed along each division line L is filled with the mold resin M. Accordingly, the mold resin M filling each groove 12 of the packaged wafer PW forms a side surface of each device chip C to be obtained by dividing the packaged wafer PW (see FIG. 10). That is, the mold resin M fully covers not only the upper surface (front side) of each device chip C, but also the side surface thereof, thereby improving the appearance of each device chip C. In the mold resin filling step, the peripheral cut grooves 15 of the packaged wafer PW are not covered with the mold resin M. Accordingly, the packaged wafer PW can be divided into the individual device chips C with reference to each peripheral cut groove 15 in the subsequent step.

Accordingly, unlike the prior art depicted in FIGS. 2A and 2B, it is unnecessary to perform polishing or trimming to the wafer W. Further, unlike the prior art depicted in FIGS. 3A and 3B, the cutting blade 22 is not lowered from the position directly above the wafer W, but lowered from the position radially outside the wafer W. Then, the cutting blade 22 is relatively fed to form the groove 12 along each division line L. Accordingly, the time required for formation of each groove 12 can be reduced. As a modification, the mold resin filling step may be performed before performing the peripheral cut groove forming step, provided that the mold resin filling step is to be performed after performing the groove forming step and the chamfered portion removing step.

As described above, in the manufacturing method for the packaged wafer PW according to this preferred embodiment, the groove 12 is formed along each division line L on the front side of the wafer W so as to extend from one end to the other end of each division line L. Thereafter, the chamfered portion 11 of the wafer W is removed to thereby project the device area A1 of the wafer W. Thereafter, the die 36 of the molding apparatus is set on the front side of the wafer W in such a manner that the recess of the die 36 is engaged with the device area A1 projected. In this condition, the side wall 37 of the die 36 abuts against the bottom surface 14 of the step portion 13 of the wafer W at a level lower than that of the bottom of each groove 12, so that the outer circumference of the wafer W is liquid-sealed by the side wall 37 of the die 36. Accordingly, in filling the mold resin M into the space 18 defined between the die 36 and the wafer W, the mold resin M is prevented from leaking from the outer circumference of the wafer W to the outside thereof. Thus, the packaged wafer PW can be well manufactured, wherein the device area A1 is covered with the mold resin M and each groove 12 is filled with the mold resin M.

Figure 9:
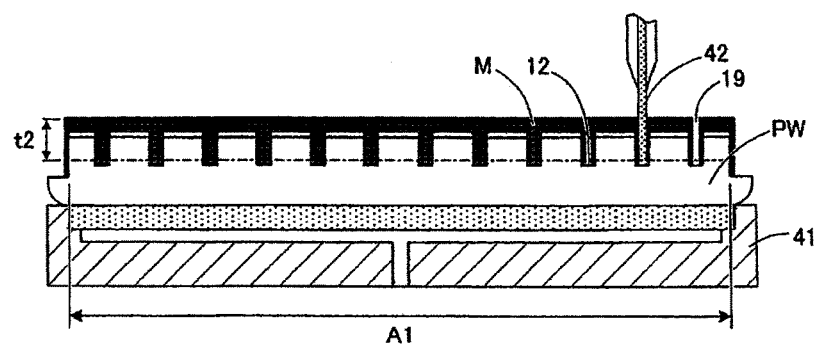
FIG. 9 is a sectional view depicting a cut groove forming step of a device chip manufacturing method according to a preferred embodiment of the present invention.

A device chip manufacturing method according to a preferred embodiment of the present invention will now be described in detail with reference to FIGS. 9 and 10. FIG. 9 is a sectional view depicting a cut groove forming step in this preferred embodiment, and FIG. 10 is a sectional view depicting a dividing step in this preferred embodiment.

First, the cut groove forming step is performed as depicted in FIG. 9. In the cut groove forming step, the packaged wafer PW is transferred to a chuck table 41 of a cutting apparatus and then held on the chuck table 41 under suction in the condition where the front side of the packaged wafer PW is oriented upward. In this step, a cutting blade 42 having a thickness smaller than the width of each groove 12 is used, so as to leave the mold resin M in each groove 12. Since the device area A1 is covered with the mold resin M, the division lines L (see FIG. 6) are invisible. Accordingly, by using each peripheral cut groove 15 (see FIG. 8) formed on the extension of the corresponding division line L as an alignment mark, the cutting blade 42 is aligned with each peripheral cut groove 15 at a position radially outside the packaged wafer PW.

Thereafter, the cutting blade 42 is lowered to a depth greater than the finished thickness t2 of the packaged wafer PW. Thereafter, the cutting blade 42 is rotated and the chuck table 41 is fed relative to the cutting blade 42. As a result, the packaged wafer PW held on the chuck table 41 is half-cut along the center of the groove 12 (filled with the mold resin M) corresponding to each peripheral cut groove 15 by the cutting blade 42 to thereby form a cut groove 19 along the center of this groove 12 filled with the mold resin M, wherein the depth of the cut groove 19 is greater than the finished thickness t2. This cutting operation is repeated for all of the other grooves 12 of the packaged wafer PW held on the chuck table 41, thereby forming a similar cut groove 19 along each groove 12 as depicted in FIG. 9. In this manner, the cutting blade 42 having a thickness smaller than the width of each groove 12 filled with the mold resin M is used to form the cut groove 19 along each groove 12 so that the mold resin M is left in each groove 12.

Figure 10:
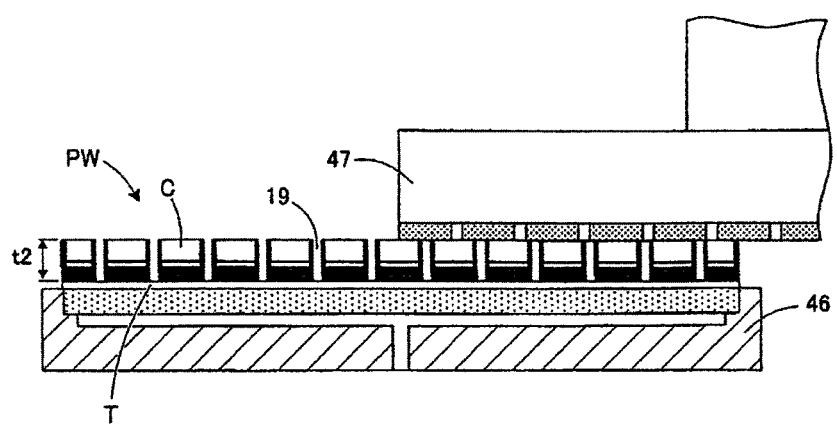
FIG. 10 is a sectional view depicting a dividing step subsequent to the cut groove forming step depicted in FIG. 9.

After performing the cut groove forming step, the dividing step is performed as depicted in FIG. 10. In the dividing step, a protective tape T is first attached to the front side of the packaged wafer PW. Thereafter, the packaged wafer PW is transferred to a chuck table 46 of a grinding apparatus and then held through the protective tape T on the chuck table 46 under suction in the condition where the back side of the packaged wafer PW is oriented upward. Thereafter, a grinding wheel 47 is rotated and the chuck table 46 is also rotated. Thereafter, the grinding wheel 47 is lowered to come into contact with the back side of the packaged wafer PW, thereby grinding the back side of the packaged wafer PW until the thickness of the packaged wafer PW becomes the finished thickness t2. As a result, each cut groove 19 is exposed to the back side of the packaged wafer PW to thereby divide the packaged wafer PW into individual device chips C. Accordingly, the front side (device surface) and the side surface of each device chip C are covered with the mold resin M.

The device chip manufacturing method of the present invention is not limited to the above method including the steps of forming the cut groove 19 along each division line L (each groove 12 filled with the mold resin M) on the front side of the packaged wafer PW and next grinding the back side of the packaged wafer PW to thereby divide the packaged wafer PW into the individual device chips C. That is, any other methods capable of manufacturing the device chips C from the packaged wafer PW may be adopted. For example, as will be hereinafter described, the back side of the packaged wafer PW may be first ground to reach the finished thickness t2, and the packaged wafer PW may be next cut along each division line L to obtain the individual device chips C.

Figure 11:
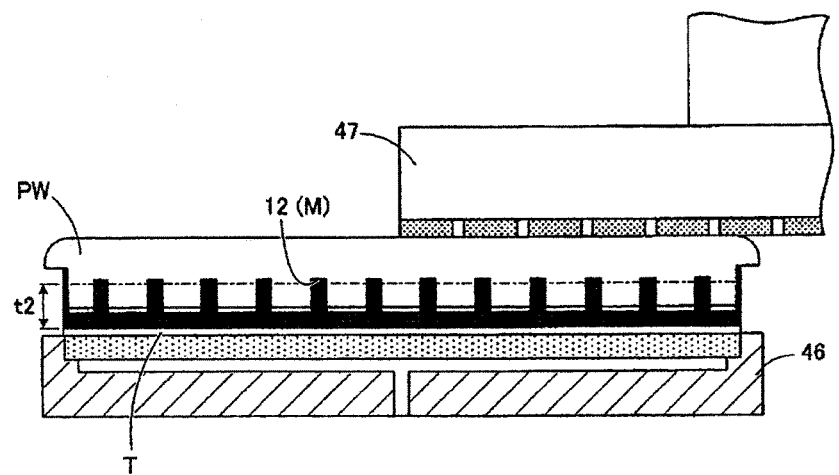
FIG. 11 is a sectional view depicting a grinding step of a device chip manufacturing method according to another preferred embodiment of the present invention.
Figure 12:
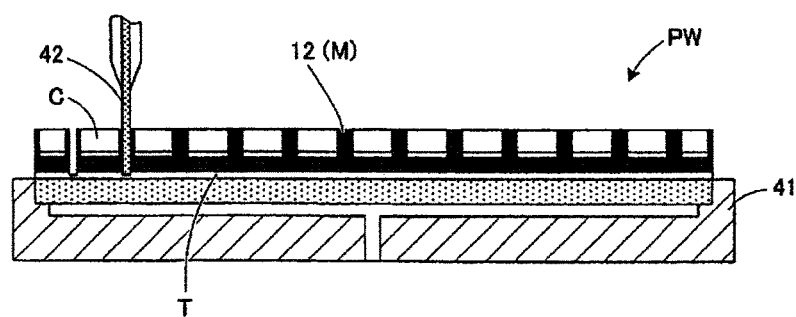
FIG. 12 is a sectional view depicting a dividing step subsequent to the grinding step depicted in FIG. 11.

Such a device chip manufacturing method according to another preferred embodiment of the present invention will now be described with reference to FIGS. 11 and 12. FIG. 11 is a sectional view depicting a grinding step in this preferred embodiment, and FIG. 12 is a sectional view depicting a dividing step in this preferred embodiment. In this preferred embodiment, the packaged wafer PW is first ground to be thinned and next divided into the individual device chips C. Accordingly, although the peripheral cut grooves 15 are formed on the packaged wafer PW, these grooves 15 are removed in grinding the packaged wafer PW. As a result, in the dividing step, the grooves 12 exposed to the back side of the packaged wafer PW by the grinding step are used as an alignment mark rather than the peripheral cut grooves 15.

This preferred embodiment will now be described in more detail. First, the grinding step is performed as depicted in FIG. 11. In the grinding step, a protective tape T is first attached to the front side of the packaged wafer PW. Thereafter, the packaged wafer PW is transferred to a chuck table 46 of a grinding apparatus and then held through the protective tape T on the chuck table 46 under suction in the condition where the back side of the packaged wafer PW is oriented upward. Thereafter, a grinding wheel 47 is rotated and the chuck table 46 is also rotated. Thereafter, the grinding wheel 47 is lowered to come into contact with the back side of the packaged wafer PW, thereby grinding the back side of the packaged wafer PW until the thickness of the packaged wafer PW becomes the finished thickness t2. As a result, each groove 12 filled with the mold resin M is exposed to the back side of the packaged wafer PW.

After performing the grinding step, the dividing step is performed as depicted in FIG. 12. In the dividing step, the packaged wafer PW is transferred to a chuck table 41 of a cutting apparatus and then held through the protective tape T on the chuck table 41 under suction in the condition where the back side of the packaged wafer PW is oriented upward. In this step, a cutting blade 42 having a thickness smaller than the width of each groove 12 is used, so as to leave the mold resin M in each groove 12. As described above, the peripheral cut grooves 15 (see FIG. 8) have been removed from the packaged wafer PW by the grinding step. Accordingly, the cutting blade 42 is aligned with the center of a predetermined one of the grooves 12 (filled with the mold resin M) exposed to the back side of the packaged wafer PW.

Thereafter, the cutting blade 42 is lowered to a depth such that the packaged wafer PW can be fully cut. Thereafter, the cutting blade 42 is rotated and the chuck table 41 is fed relative to the cutting blade 42. As a result, the packaged wafer PW held through the protective tape T on the chuck table 41 is fully cut along the center of the predetermined groove 12 filled with the mold resin M by the cutting blade 42. This cutting operation is repeated for all of the other grooves 12 of the packaged wafer PW held through the protective tape T on the chuck table 41, thereby dividing the packaged wafer PW along all the division lines L (see FIG. 6) to obtain the individual device chips C as depicted in FIG. 12. In this manufacturing method for the device chips C, the packaged wafer PW is not required to have the peripheral cut grooves 15, so that the peripheral cut groove forming step of the packaged wafer manufacturing method mentioned above may be omitted.

The present invention is not limited to the above preferred embodiments, but various modifications may be made. In the above preferred embodiments, the size, shape, etc. depicted in the attached drawings are merely illustrative and they may be suitably changed within the scope where the effect of the present invention can be exhibited. Further, various modifications may be made without departing from the scope of the object of the present invention.

For example, while the mold resin M is filled into the space 18 defined between the die 36 and the wafer W in the condition where the die 36 is engaged with the front side of the wafer W in the mold resin filling step mentioned above, the present invention is not limited to this configuration. The mold resin filling step in the present invention may be performed by dropping a suitable amount of mold resin M onto the front side of the wafer W and next pressing the die 36 against the mold resin M on the front side of the wafer W to thereby fill the space 18 with the mold resin M.

Further, while the peripheral cut groove 15 is formed on the bottom surface 14 of the step portion 13 of the wafer W so as to be aligned with the extension of any one of the division lines L in the peripheral cut groove forming step mentioned above, the present invention is not limited to this configuration. The peripheral cut groove forming step in the present invention may be performed by forming the peripheral cut groove 15 on the bottom surface 14 of the step portion 13 of the wafer W so that the peripheral cut groove 15 is aligned with the extension of at least one of the division lines L. For example, a plurality of peripheral cut grooves 15 may be formed on the extensions of all the division lines L.

Further, while each peripheral cut groove 15 is formed as an alignment mark on the packaged wafer PW as mentioned above, the present invention is not limited to this configuration. The alignment mark may be provided by any mark capable of specifying each division line L of the packaged wafer PW. For example, the alignment mark may be provided by a mark formed by laser processing or the like. Further, while the groove forming step, the chamfered portion removing step, and the peripheral cut groove forming step are performed by different apparatuses as mentioned above, these steps may be performed by the same apparatus.

As described above, the present invention has such an effect that the front side of the wafer can be covered with the mold resin and each groove formed on the front side of the wafer can be properly filled with the mold resin. In particular, the present invention is useful for a manufacturing method for a packaged wafer in WL-CSP or the like and also for a manufacturing method for device chips from such a packaged wafer.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A packaged wafer manufacturing method comprising:
    a groove forming step of forming a plurality of grooves along a plurality of crossing division lines on a front side of a wafer having a device area where a plurality of devices are formed in a plurality of separate regions defined by said division lines, each device having bumps, the outer circumference of said wafer being formed with a chamfered portion, each groove having a depth greater than the finished thickness of said wafer;
    a chamfered portion removing step of cutting said chamfered portion of said wafer to a depth greater than the depth of each groove by using a first cutting blade, thereby removing said chamfered portion and resultantly forming a step portion having a flat bottom surface along the outer circumference of said wafer, whereby said device area of said wafer is projected; and
    a mold resin filling step of using a die of a molding apparatus, said die having a recess adapted to engage with said device area projected, after performing said groove forming step and said chamfered portion removing step, next making said die abut against said bottom surface of said step portion of said wafer in a condition where a predetermined space is defined between the upper surface of said device area and the bottom surface of said recess of said die, and next filling a mold resin into said predetermined space;
    whereby said device area of said wafer is covered with said mold resin and each groove of said wafer is filled with said mold resin to thereby obtain a packaged wafer.

2. The packaged wafer manufacturing method according to claim 1, further comprising a peripheral cut groove forming step of cutting the outer circumferential portion of said wafer at both ends of at least one of said division lines by using a second cutting blade before or after performing said chamfered portion removing step, thereby forming a peripheral cut groove aligned with said at least one division line;
    said peripheral cut groove being used as an alignment mark in a subsequent step to be performed after said peripheral cut groove forming step.

3. A device chip manufacturing method comprising:
    a groove forming step of forming a plurality of grooves along a plurality of crossing division lines on a front side of a wafer having a device area where a plurality of devices are formed in a plurality of separate regions defined by said division lines, each device having bumps, the outer circumference of said wafer being formed with a chamfered portion, each groove having a depth greater than the finished thickness of said wafer;
    a chamfered portion removing step of cutting said chamfered portion of said wafer to a depth greater than the depth of each groove by using a first cutting blade, thereby removing said chamfered portion and resultantly forming a step portion having a flat bottom surface along the outer circumference of said wafer, whereby said device area of said wafer is projected;
    a peripheral cut groove forming step of cutting the outer circumferential portion of said wafer at both ends of at least one of said division lines by using a second cutting blade, thereby forming a peripheral cut groove aligned with said at least one division line;
    a mold resin filling step of using a die of a molding apparatus, said die having a recess adapted to engage with said device area projected, after performing said chamfered portion removing step, next making said die abut against said bottom surface of said step portion of said wafer in a condition where a predetermined space is defined between the upper surface of said device area and the bottom surface of said recess of said die, and next filling a mold resin into said predetermined space, whereby said device area of said wafer is covered with said mold resin and each groove of said wafer is filled with said mold resin to thereby obtain a packaged wafer;
    an alignment step of aligning a third cutting blade with each division line of said wafer with reference to said peripheral cut groove as an alignment mark, after performing said mold resin filling step;

a cut groove forming step of cutting the front side of said packaged wafer along each division line by using said third cutting blade having a thickness smaller than the width of each groove filled with said mold resin, after performing said alignment step, thereby forming a cut groove along the center of each groove filled with said mold resin, said cut groove having a depth greater than the finished thickness of each device chip to be formed from said packaged wafer; and a dividing step of grinding the back side of said packaged wafer until the thickness of said packaged wafer becomes the finished thickness of each device chip, after performing said cut groove forming step, thereby exposing each cut groove to the back side of said packaged wafer and resultantly dividing said packaged wafer into individual device chips each surrounded by said mold resin.

* * * * *